(12) United States Patent
Glancy et al.

(10) Patent No.: US 10,261,856 B2
(45) Date of Patent: Apr. 16, 2019

(54) BITWISE SPARING IN A MEMORY SYSTEM

(71) Applicant: International Business Machines Corporation, Armonk, NY (US)

(72) Inventors: Stephen P. Glancy, Poughkeepsie, NY (US); Frank LaPietra, Poughquag, NY (US); Kevin M. Mcilvain, Delmar, NY (US); Jeremy R Neaton, Fishkill, NY (US); Richard D. Wheeler, Millerton, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/343,308

(22) Filed: Nov. 4, 2016

(65) Prior Publication Data

US 2018/0129554 A1    May 10, 2018

(51) Int. Cl.
  *G06F 11/10* (2006.01)
  *G06F 12/00* (2006.01)
  *G11C 29/00* (2006.01)
  *G11C 29/04* (2006.01)

(52) U.S. Cl.
  CPC ........ *G06F 11/102* (2013.01); *G06F 11/1048* (2013.01); *G06F 11/1056* (2013.01); *G06F 12/00* (2013.01); *G11C 29/76* (2013.01); *G11C 2029/0411* (2013.01)

(58) Field of Classification Search
  None
  See application file for complete search history.

(56) References Cited

U.S. PATENT DOCUMENTS

| | | | | |
|---|---|---|---|---|
| 4,376,300 A | * | 3/1983 | Tsang | G11C 29/76 365/200 |
| 5,392,292 A | * | 2/1995 | Davis | G11C 29/832 711/170 |
| 5,491,655 A | * | 2/1996 | Hirose | G11C 7/14 365/177 |
| 5,796,662 A | * | 8/1998 | Kalter | G11C 29/848 365/189.08 |
| 6,567,960 B2 | | 5/2003 | Chang et al. | |
| 6,816,986 B1 | * | 11/2004 | Fanning | G11C 29/76 714/42 |

(Continued)

OTHER PUBLICATIONS

Coyle et al., "DRAM Sparing Using Shifting Technique," ip.com, IPCOM000121702D, IBM TDB, v34, n4B, pp. 244-245, Sep. 1991.

(Continued)

*Primary Examiner* — J. H. Hur
(74) *Attorney, Agent, or Firm* — Cantor Colburn LLP; Bryan Bortnick

(57) ABSTRACT

An aspect includes providing communication links from a memory controller to contents of a plurality of bit locations in a plurality of memory devices. A failing bit location in the plurality of bit locations is detected by the memory controller. A replacement bit location for the failing bit location is selected and a replacement communication link to the replacement bit location is provided by the memory controller. A request to access contents of the failing bit location received after the selecting and providing the replacement communication link is performed by accessing contents of the replacement bit location via the replacement communication link.

9 Claims, 6 Drawing Sheets

(56) References Cited

U.S. PATENT DOCUMENTS

| | | | |
|---|---|---|---|
| 7,292,950 B1 | 11/2007 | Resnick | |
| 8,843,806 B2 | 9/2014 | Meaney et al. | |
| 2003/0081464 A1* | 5/2003 | Vlasenko | G11C 15/00 365/200 |
| 2009/0006900 A1* | 1/2009 | Lastras-Montano | G06F 11/1044 714/42 |
| 2009/0063896 A1* | 3/2009 | Lastras-Montano | G11C 29/76 714/6.13 |
| 2009/0217281 A1 | 8/2009 | Borkenhagen | |
| 2011/0007588 A1* | 1/2011 | Li | G11C 5/02 365/200 |
| 2013/0176763 A1* | 7/2013 | Ware | G11C 29/808 365/51 |
| 2013/0279280 A1* | 10/2013 | Franzon | G11C 29/04 365/200 |
| 2016/0093404 A1 | 3/2016 | Huang et al. | |

OTHER PUBLICATIONS

Nair et al., "Citadel: Efficiently Protecting Stacked Memory from TSV and Large Granularity Failures," ACM Trans. on Architecture and Code Optimization, 12.4 (Jan. 2016) 7 pages.

O, Seongil, et al., "CIDR: A Cache Inspired Area-Efficient DRAM Resilience Architecture Against Permanent Faults," IEEE Computer Architecture Letters, v.14, n.1, pp. 17-20, Jan.-Jun. 2015.

\* cited by examiner

BITWISE SPARING IN A MEMORY SYSTEM

BACKGROUND

The present invention relates to computer memory, and more specifically, to bitwise sparing in a memory system.

SUMMARY

Embodiments include a method, system, and computer program product for bitwise sparing in a memory system. A method includes providing communication links from a memory controller to contents of a plurality of bit locations in a plurality of memory devices. A failing bit location in the plurality of bit locations is detected by the memory controller. A replacement bit location for the failing bit location is selected and a replacement communication link to the replacement bit location is provided by the memory controller. A request to access contents of the failing bit location received after the selecting and providing the replacement communication link is performed by accessing contents of the replacement bit location via the replacement communication link.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments described herein provide bitwise sparing techniques for a memory system. In accordance with one or more embodiments, a read or write access to a failing bit location in a memory device is replaced with the data from the same read or write access to a non-failing bit location in the same memory or different memory device. By implementing embodiments described herein that provide sparing over single bits, bit locations in a single spare memory device can be used to correct detected bit errors in multiple memory devices. In addition, if all of the bit locations in a single memory device are failing, the entire spare memory device can be used by the single memory device. In one or more embodiments all of the processing is performed by logic contained in the memory controller or other processor external to the memory devices.

In contemporary implementations of sparing, a spare memory device can be used to replace a failing memory device by using a multiplexer to enable the sparing. In contemporary implementations, if a memory device is experiencing memory fails due to a single bad bit, the entire memory device may be replaced with a spare memory device in order to correct the single failing bit. If another memory device experiences a catastrophic fail (i.e., one that cannot be corrected by an error correcting code or "ECC), then this may cause the entire memory system to fail (e.g., a checkstop may occur) as the spare memory device is already deployed on the memory device with the single failing bit.

As used herein the term "memory device" refers to any medium used for storing data such as, but not limited to: dynamic random access memory (DRAM), static random access memory (SRAM), read-only memory (ROM), storage devices, flash memory, magnetoresistive random-access memory (MRAM), and non-volatile dual in-line memory modules (NVDIMMs). The memory devices can be located on one or more printed circuit boards such as, for example, memory modules (e.g., buffered, unbuffered, custom, load-reduced, planar, etc.).

Figure 1:
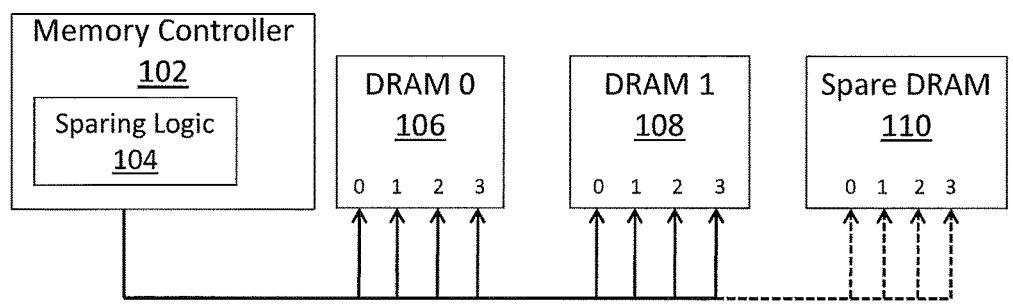
FIG. 1 illustrates a block diagram of a memory controller and memory devices in accordance with one or more embodiments.

Turning now to FIG. 1, a block diagram 100 of a memory controller and memory devices is generally shown in accordance with one or more embodiments. The memory devices shown in the embodiment of FIG. 1 are implemented by four bit (or "x4") DRAMs 106 108 110. Embodiments are not limited to x4 DRAMS and can utilize DRAMs of any size (e.g., x8, x16, x32, etc.). For ease of explanation, only three memory devices are shown in FIG. 1, however embodiments are not limited to three DRAMS and can be implemented in memory systems with any number of DRAMs (e.g., nine, eighteen, etc.).

FIG. 1 shows a memory controller 102 that includes sparing logic 104 that can be used to implement the processing described herein. The memory controller 102 shown in FIG. 1 is coupled to DRAM 0 106, DRAM 1 108 and spare DRAM 110 via one or more communication links. In one or more embodiments, the communication links are implemented by a data bus that includes one or more physical wires. In accordance with one or more embodiments, multiplexing instructions contained in the memory controller 102 (e.g., in the sparing logic 104) can be utilized to link particular data bits to particular bit locations in the memory devices. A physical or logical multiplexer can be located in the memory controller 102 and/or on a separate multiplexer circuit.

As shown in FIG. 1, the memory controller 102, during a write access, sends out eight bits in sequential order via eight communication links, a first bit to DRAM 0 106 bit 0, a second bit to DRAM 0 106 bit 1, a third bit to DRAM 0 106 bit 2, a fourth bit to DRAM 0 106 bit 3, a fifth bit to DRAM 1 108 bit 0, a sixth bit to DRAM 1 108 bit 1, a seventh bit to DRAM 1 108 bit 2, and an eighth bit to DRAM 1 108 bit 3. In the embodiment shown in FIG. 1, the spare DRAM 110 does not receive any data during normal operation and prior to any bits of the spare DRAM 110 being used in place of a failing bit location in DRAM 0 106 or DRAM 1 108. In one or more other embodiments, dummy data is sent to the spare DRAM 110 prior to bits of the spare DRAM 110 being used in place of a failing bit location in DRAM 0 106 or DRAM 1 108.

Similarly, during a read access, the memory controller reads eight bits in sequential order via eight communication links, a first bit form DRAM 0 106 bit 0, a second bit from DRAM 0 106 bit 1, a third bit from DRAM 0 106 bit 2, a fourth bit from DRAM 0 106 bit 3, a fifth bit from DRAM 1 108 bit 0, a sixth bit from DRAM 1 108 bit 1, a seventh bit from DRAM 1 108 bit 2, and an eighth bit from DRAM 1 108 bit 3. In the embodiment shown in FIG. 1, the memory controller 102 does not read any data from the spare DRAM 110 prior to any bits of the spare DRAM 110 being used in place of a failing bit location in DRAM 0 106 or DRAM 1 108. In one or more other embodiments, dummy data that is not used by the memory controller 102 is read from the bit locations in the spare DRAM 110 prior to bits of the spare DRAM 110 being used in place of a failing bit location in DRAM 0 106 or DRAM 1 108.

Figure 2:
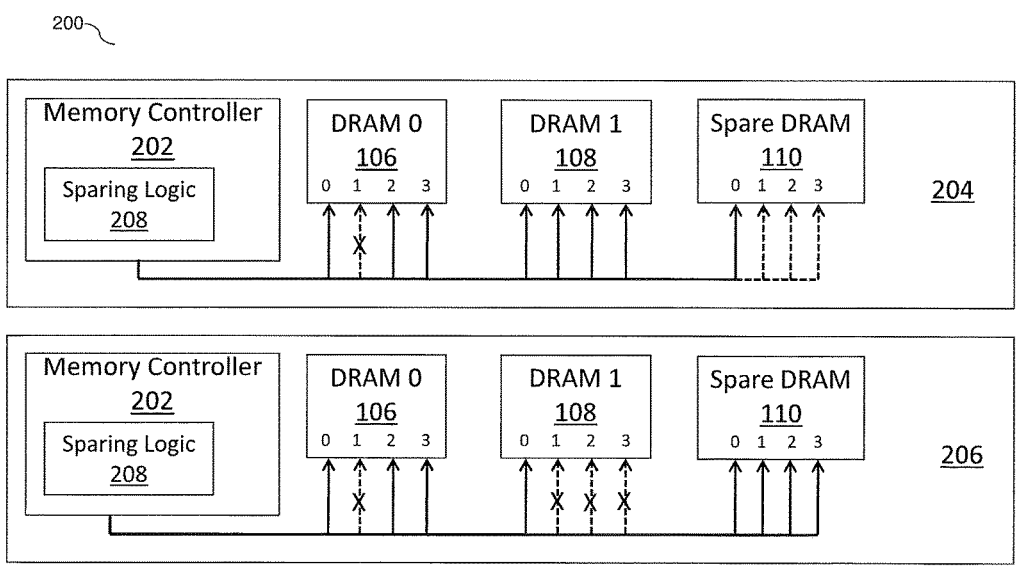
FIG. 2 illustrates a block diagram of a memory controller and memory devices for implementing bitwise sparing using a spare memory device in accordance with one or more embodiments.

Turning now to FIG. 2, a block diagram 200 of a memory controller and memory devices for implementing bitwise sparing using a spare memory device is generally shown in accordance with one or more embodiments. FIG. 2 shows an embodiment of the configuration shown in FIG. 1 after a bit error has been detected. As shown in block 204 of FIG. 2, an error is detected at DRAM 0 106 bit 1 and spare DRAM 110 bit 0 is used as a replacement bit location for the failing bit location (bit 1) in DRAM 0 106. A failing bit location can be detected using standard error detecting methods such as, but not limited to a cyclic redundancy check (CRC) and an error correction code (ECC).

In accordance with one or more embodiments, the memory controller 202 uses multiplexer logic (included for example in sparing logic 208 located on the memory controller 202) to access bit 0 in the spare DRAM 110 in place of bit 1 in DRAM 0 106. In accordance with one or more embodiments, the memory controller 202 tracks, using for example sparing logic 208, which bit location(s) is a failing bit location(s), and its corresponding spare or replacement bit location(s). In the example shown in block 204, sparing logic 208 in the memory controller 202 keeps track of spare DRAM 110 bit 0 being used as a replacement bit location for DRAM 0 106 bit 1, and adjusts a multiplexer to provide a communication link to utilize the replacement bit location whenever a request to access the failing bit location is received.

Also shown in block 206 of FIG. 2, errors are subsequently detected at bits 1, 2, and 3 of DRAM 1 108; and bits 1, 2, and 3 of spare DRAM 110 are used by the memory controller 202 as replacement locations for the failing bit locations in DRAM 1 108. The embodiment shown in FIG. 2 can require a relatively large multiplexer as the multiplexer needs to have the capability to multiplex each failing non-spare bit to any of the spare bits. In one or more embodiment, each spare bit has an N-wide multiplexer, where N is the width of the data bus. In the example shown in FIG. 2, four 8-bit wide multiplexers are utilized since the number of spare bits, S, is four and the width of the data bus, N, is eight. For a standard DDR3/4 server grade memory, four or eight (depends upon the width of the spare device) 72-bit wide multiplexers can be utilized.

Figure 3:
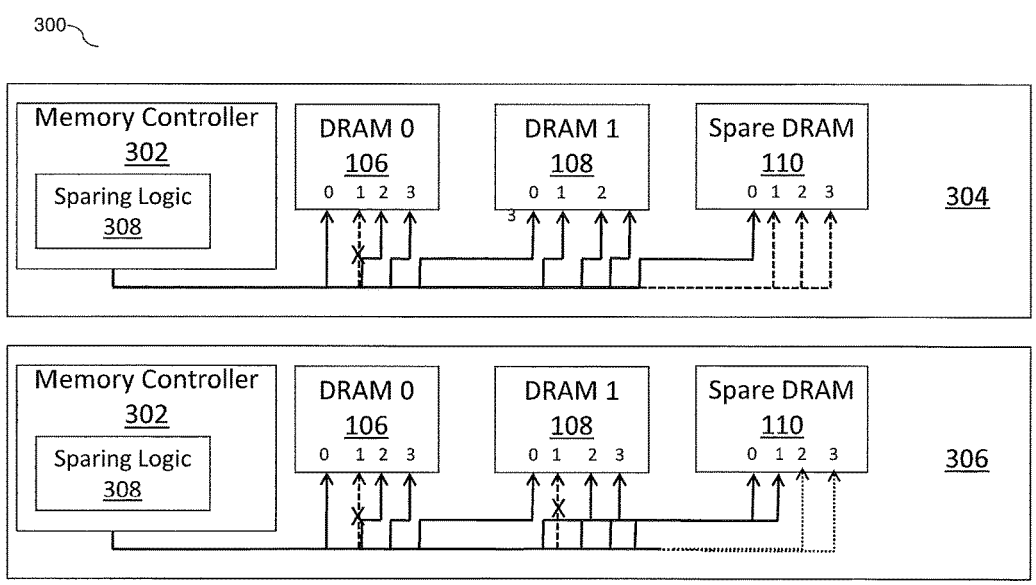
FIG. 3 illustrates a block diagram of a memory controller and memory devices for implementing bitwise sparing using shifting in accordance with one more embodiments.

Turning now to FIG. 3, a block diagram 300 of a memory controller and memory devices for implementing bitwise sparing using shifting is generally shown in accordance with one more embodiments. FIG. 3 shows an embodiment of the configuration shown in FIG. 1 after a bit error has been detected. In comparison to the embodiment shown in FIG. 2, the embodiment shown in FIG. 3 can utilize smaller multiplexers to perform the bitwise sparing. In the embodiment shown in FIG. 3, sparing can be supported by N-S+1 S-bit wide multiplexers or five 4-bit wide multiplexers (at DRAM 1 108 bits 0-3 and spare DRAM 110 bit 0), along with two 3-bit multiplexers (at DRAM 0 106 bit 3 and spare DRAM 110 bit 1), two 2-bit multiplexers (at DRAM 0 106 bit 2 and spare DRAM 110 bit 2), and two 1-bit multiplexers (at DRAM 0 106 bit 1 and spare DRAM 110 bit 3). In addition, an enable or disable bit can be in front of each of the multiplexers to indicate whether or not the multiplexer should be utilized. The above example illustrates the number and sizes of multiplexers utilized by the embodiment shown in FIG. 3, where there are four spare bits (i.e., S=4). Thus, as shown in this example, two multiplexers are utilized for each integer value from S−1 down to 1-bit wide multiplexers to allow for all bits to be shifted over. Those skilled in the art will appreciate that other numbers and sizes of multiplexers are utilized for different memory configurations to allow for all bits to be shifted over.

As shown in block 304 of FIG. 3, an error is detected at DRAM 0 106 bit 1. Each bit at and after the failing bit location (DRAM 0 106 bit 1) is shifted (e.g., by a multiplexer external to the memory DRAMS 106 108 110) by one position to the right for each failing bit prior to this one, thus keeping the sequential order of the bits on the data bus. Thus, DRAM 0 106 bit 2 is used as a replacement bit location for DRAM 0 106 bit 1, and DRAM 0 106 bit 2 is shifted to DRAM 0 106 bit 3, and DRAM 0 106 bit 3 is shifted to DRAM 1 108 bit 0, DRAM 1 108 bit 0 is shifted to DRAM 1 108 bit 1, DRAM 1 108 bit 1 is shifted to DRAM 1 108 bit 2, DRAM 1 108 bit 2 is shifted to DRAM 1 108 bit 3, and DRAM 1 108 bit 3 is shifted to spare DRAM 110 bit 0.

As shown in block 306 of FIG. 3, an error is subsequently detected at bit position 1 of DRAM 1 108 and each bit at and after the failing bit location (DRAM 1 108 bit 1) is shifted (e.g., by a multiplexer external to the memory DRAMS 106 108 110) by two positions to the right. If a third failing bit location is detected then bit locations are shifted over by three positions to the right, and so on. In this manner, a number of failing bit locations up to the number of bits in the spare DRAM 10 can be replaced with spare bit locations. In accordance with one or more embodiments, sparing logic 308 on the memory controller 302 keeps track of how many failing bits precede each bit location and performs the required multiplexing of the data bit during a memory access.

Figure 4:
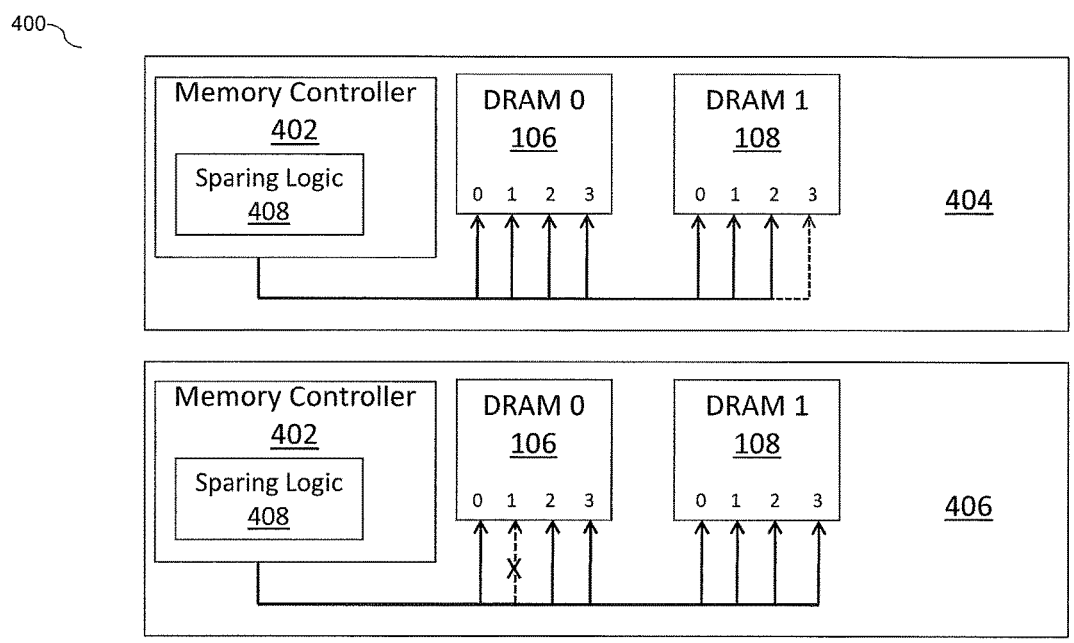
FIG. 4 illustrates a block diagram of a memory controller and memory devices for implementing bitwise sparing using only one spare bit in accordance with one or more embodiments.

Turning now to FIG. 4, a block diagram 400 of a memory controller and memory devices for implementing bitwise sparing using only one spare bit is generally shown in accordance with one or more embodiments. The configuration shown in FIG. 4 is similar to the configuration shown in FIG. 1 without the spare DRAM. In the embodiment shown in block 404 of FIG. 4, DRAM 1 108 bit 3 is a spare bit location that can be used in the event of a bit location failure being detected. As shown in block 406 of FIG. 4, an error is detected at DRAM 0 106 bit 1 and DRAM 1 108 110 bit 3 is used as a replacement bit location for the failing bit location (bit 1) in DRAM 0 106. In accordance with one or more embodiments, sparing logic 408 keeps track of the failing bit location and performs the multiplexing of the data bit during a memory access. In other embodiments, the DRAM 1 108 can have two or more spare bits.

Figure 5:
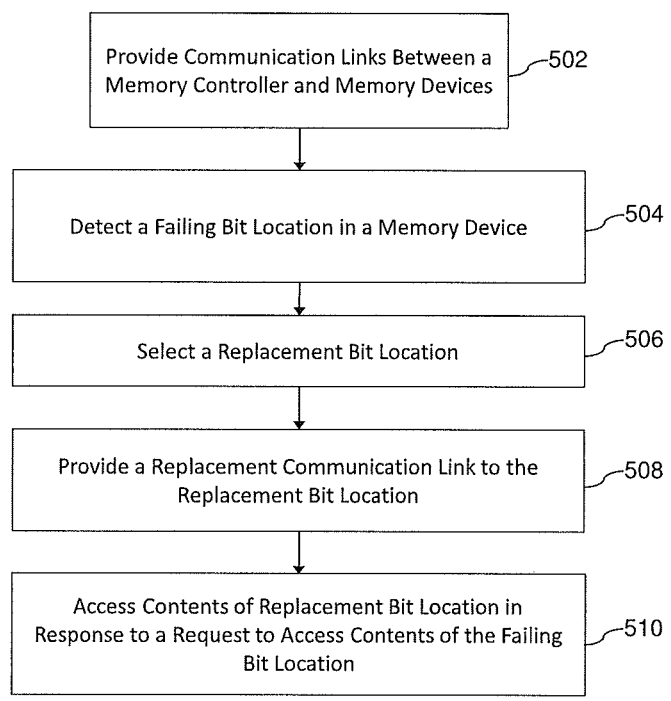
FIG. 5 illustrates a flow diagram of a process for performing bitwise sparing in accordance with one or more embodiments.

Turning now to FIG. 5, a flow diagram 500 of a process for performing bitwise sparing is generally shown in accordance with one or more embodiments. The process shown in FIG. 5 can be implemented by a processor in a memory controller executing sparing logic. At block 502, communication links (e.g., a data bus) between a memory controller and memory devices are provided. The communication links can be set by the memory controller via one or more multiplexers and can include physical (e.g., wire) or logical connections to access to contents of bit locations in the memory devices. Access can include read and/or write accesses to the bit locations in the memory devices. At block 504, a failing bit location is detected in one of the memory devices, and at block 506 a replacement bit location is selected by the memory controller. The replacement bit location can be in a dedicated spare memory device as shown in FIG. 2, it can be a next bit location in the same memory device as shown in FIG. 3, or it can be a dedicated spare bit location in one of the memory devices as shown in FIG. 4.

Once the replacement bit location is selected, a replacement communication link is provided to the replacement bit location at block 508. As described previously herein this can be performed using one or more multiplexers to redirect the bits on the data bus to different bit locations in the memory devices. At block 510, subsequent accesses to the failing bit location are serviced using the replacement bit location. Blocks 504 through 510 of FIG. 5 can be repeated for each failing bit location that is detected in the memory devices until all of the spare bit locations are utilized as replacement locations.

Figure 6:
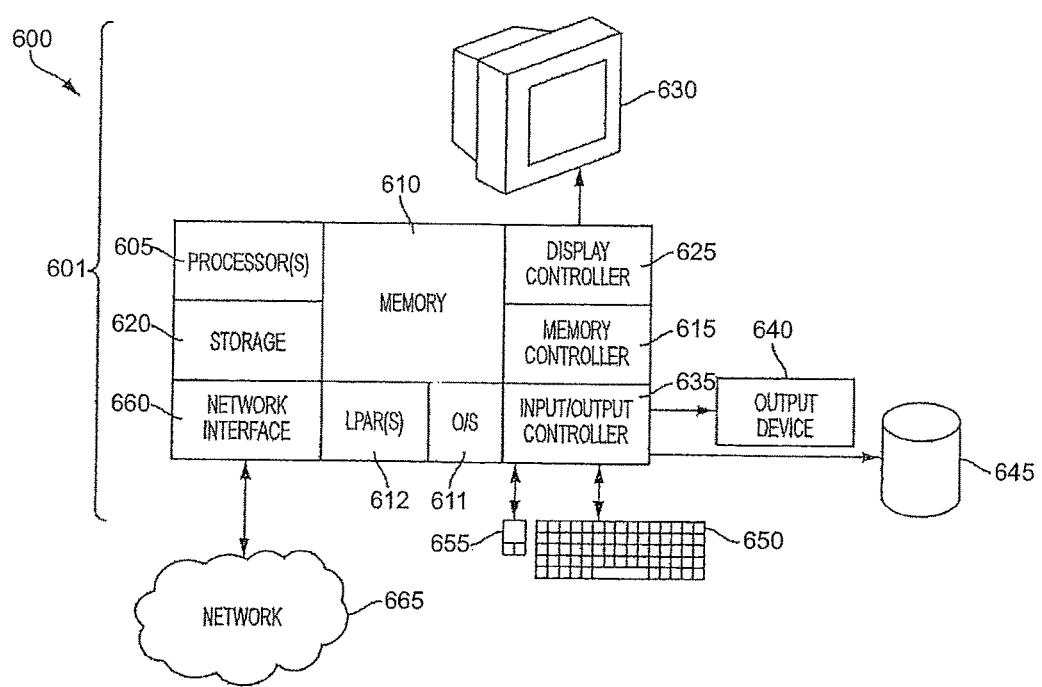
FIG. 6 illustrates a computer system for bitwise sparing in accordance with one or more embodiments.

Turning now to FIG. 6, a computer system for bitwise sparing is generally shown according to one or more embodiments. In accordance with one or more embodiments the processing described herein is performed by a processor located on a memory controller 615 and the memory devices are contained in a memory 610. The methods described herein can be implemented in hardware, software (e.g., firmware), or a combination thereof. In an exemplary embodiment, the methods described herein are implemented in hardware as part of the microprocessor of a special or general-purpose digital computer, such as a memory controller or mainframe computer.

In an exemplary embodiment, in terms of hardware architecture, as shown in FIG. 6, the computer 601 includes one or more processors 605, memory 610 coupled to a memory controller 615, and one or more input and/or output (I/O) devices 640, 645 (or peripherals) that are communicatively coupled via a local input/output controller 635. The input/output controller 635 can be, for example but not limited to, one or more buses or other wired or wireless connections, as is known in the art. The input/output controller 635 may have additional elements, which are omitted for simplicity, such as controllers, buffers (caches), drivers, repeaters, and receivers, to enable communications. Further, the local interface may include address, control, and/or data connections to enable appropriate communications among the aforementioned components. The input/output controller 635 may include a plurality of sub-channels configured to access the output devices 640 and 645. The sub-channels may include fiber-optic communications ports.

The processor 605 is a hardware device for executing software, particularly that stored in storage 620, such as cache storage, or memory 610. The processor 605 can be any custom made or commercially available processor, a central processing unit (CPU), an auxiliary processor among several processors associated with the computer 601, a semiconductor based microprocessor (in the form of a microchip or chip set), a macroprocessor, or generally any device for executing instructions.

The memory 610 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 610 may incorporate electronic, magnetic, optical, and/or other types of storage media. Note that the memory 610 can have a distributed architecture, where various components are situated remote from one another, but can be accessed by the processor 605.

The instructions in memory 610 may include one or more separate programs, each of which comprises an ordered listing of executable instructions for implementing logical functions. In the example of FIG. 6, the instructions in the memory 610 a suitable operating system (OS) 611. The operating system 611 essentially controls the execution of other computer programs and provides scheduling, input-output control, file and data management, memory management, and communication control and related services.

The memory 610 may include multiple logical partitions (LPARs) 612, each running an instance of an operating system. The LPARs 612 may be managed by a hypervisor, which may be a program stored in memory 610 and executed by the processor 605.

In an exemplary embodiment, a conventional keyboard 650 and mouse 655 can be coupled to the input/output controller 635. Other output devices such as the I/O devices 640, 645 may include input devices, for example but not limited to a printer, a scanner, microphone, and the like. Finally, the I/O devices 640, 645 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The system 600 can further include a display controller 625 coupled to a display 630. In an exemplary embodiment, the system 600 can further include a network interface 660 for coupling to a network 665. The network 665 can be an IP-based network for communication between the computer 601 and any external server, client and the like via a broadband connection. The network 665 transmits and receives data between the computer 601 and external systems. In an exemplary embodiment, network 665 can be a managed IP network administered by a service provider. The network 665 may be implemented in a wireless fashion, e.g., using wireless protocols and technologies, such as WiFi, WiMax, etc. The network 665 can also be a packet-switched network such as a local area network, wide area network, metropolitan area network, Internet network, or other similar type of network environment. The network 665 may be a fixed wireless network, a wireless local area network (LAN), a wireless wide area network (WAN) a personal area network (PAN), a virtual private network (VPN), intranet or other suitable network system and includes equipment for receiving and transmitting signals.

If the computer 601 is a PC, workstation, intelligent device or the like, the instructions in the memory 610 may further include a basic input output system (BIOS) (omitted for simplicity). The BIOS is a set of essential software routines that initialize and test hardware at startup, start the OS 611, and support the transfer of data among the hardware devices. The BIOS is stored in ROM so that the BIOS can be executed when the computer 601 is activated.

When the computer 601 is in operation, the processor 605 is configured to execute instructions stored within the memory 610, to communicate data to and from the memory 610, and to generally control operations of the computer 601 pursuant to the instructions.

In an exemplary embodiment, the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method comprising:
providing communication links from a memory controller to contents of a plurality of bit locations in a plurality of memory devices, each of the communication links configured to access one of the plurality of bit locations;
detecting, by the memory controller, a plurality of failing bit locations in the plurality of bit locations; and
performing for each of the detected failing bit locations:
selecting, by the memory controller, a replacement bit location for the failing bit location, the replacement bit location one of the plurality of bit locations and configured to store a single bit, the replacement bit location in a memory device of the plurality of memory devices;
providing, by the memory controller, a replacement communication link to the replacement bit location, the replacement communication link one of the communication links; and
subsequent to the selecting and providing:
receiving a request to access contents of the failing bit location; and
accessing contents of the replacement bit location via the replacement communication link in response to receiving the request,
wherein the plurality of bit locations are in a sequential order across the plurality of memory devices and the replacement bit location is a next sequential bit location in the sequential order, and
subsequent to the selecting and providing, each of the communication links to contents of bit locations that are after the failing bit location in the sequential order are shifted to a next bit location in the sequential bit location order.

2. The method of claim 1, wherein the access is a read access.

3. The method of claim 1, wherein the access is a write access.

4. The method of claim 1, further comprising:
detecting at least one additional failing bit location; and
performing the selecting and providing a replacement communication link for the at least one additional failing bit location.

5. A system comprising:
a memory controller, the memory controller comprising:
a memory having computer readable instructions; and
a processor for executing the computer readable instructions, the computer readable instructions including:
providing communication links from the memory controller to contents of a plurality of bit locations in a plurality of memory devices, each of the communication links configured to access one of the plurality of bit locations;
detecting a plurality of failing bit locations in the plurality of bit locations; and
performing for each of the detected failing bit locations:
selecting a replacement bit location for the failing bit location, the replacement bit location one of the plurality of bit locations and configured to store a single bit, the replacement bit location in a memory device of the plurality of memory devices;
providing a replacement communication link to the replacement bit location, the replacement communication link one of the communication links; and
subsequent to the selecting and providing:
receiving a request to access contents of the failing bit location; and
accessing contents of the replacement bit location via the replacement communication link in response to receiving the request,
wherein the plurality of bit locations are in a sequential order across the plurality of memory devices and the replacement bit location is a next sequential bit location in the sequential order, and
subsequent to the selecting and providing, each of the communication links to contents of bit locations that are after the failing bit location in the sequential order are shifted to a next bit location in the sequential bit location order.

6. The system of claim 5, wherein the access is a read access.

7. The system of claim 5, wherein the access is a write access.

8. The system of claim 5, wherein the computer readable instructions further include:
   detecting at least one additional failing bit location; and
   performing the selecting and providing a replacement communication link for the at least one additional failing bit location.

9. A computer program product comprising a non-transitory computer readable storage medium having program instructions embodied therewith, the program instructions executable by processing circuitry to cause the processing circuitry to perform:
   providing communication links from a memory controller to contents of a plurality of bit locations in a plurality of memory devices, each of the communication links configured to access one of the plurality of bit locations;
   detecting, by the memory controller, a plurality of failing bit locations in the plurality of bit locations; and
   performing for each of the detected failing bit locations:
      selecting, by the memory controller, a replacement bit location for the failing bit location, the replacement bit location one of the plurality of bit locations and configured to store a single bit, the replacement bit location in a memory device of the plurality of memory devices;
      providing, by the memory controller, a replacement communication link to the replacement bit location, the replacement communication link one of the communication links; and
      subsequent to the selecting and providing:
         receiving a request to access contents of the failing bit location; and
         accessing contents of the replacement bit location via the replacement communication link in response to receiving the request,
   wherein the plurality of bit locations are in a sequential order across the plurality of memory devices and the replacement bit location is a next sequential bit location in the sequential order, and
   subsequent to the selecting and providing, each of the communication links to contents of bit locations that are after the failing bit location in the sequential order are shifted to a next bit location in the sequential bit location order.

* * * * *